United States Patent [19]
Miyake et al.

[11] Patent Number: 5,825,844
[45] Date of Patent: *Oct. 20, 1998

[54] OPTICAL ARRANGEMENT AND ILLUMINATION METHOD

[75] Inventors: Akira Miyake, Utsunomiya; Yutaka Watanabe, Takanezawamachi, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 620,604

[22] Filed: Mar. 22, 1996

[30] Foreign Application Priority Data

Mar. 24, 1995 [JP] Japan ................................. 7-066012

[51] Int. Cl.$^6$ ........................................ G21K 5/00
[52] U.S. Cl. ............................... 378/34; 378/145; 378/84
[58] Field of Search ................ 378/34, 145, 84

[56] References Cited

U.S. PATENT DOCUMENTS

| | | | |
|---|---|---|---|
| 5,123,036 | 6/1992 | Uno et al. | 378/34 |
| 5,125,014 | 6/1992 | Watanabe et al. | 378/34 |
| 5,394,451 | 2/1995 | Miyake et al. | 378/34 |
| 5,444,753 | 8/1995 | Hayashida et al. | 378/34 |
| 5,461,657 | 10/1995 | Hayashida et al. | 378/84 |

*Primary Examiner*—Craig E. Church
*Attorney, Agent, or Firm*—Fitzpatrick, Cella, Harper & Scinto

[57] ABSTRACT

An X-ray optical apparatus includes a mirror element for reflecting an X-ray beam and a mechanism for applying vibrations of a predetermined excitation frequency to the mirror element to produce elastic vibrations to cause deformation of the surface of the mirror element. An illumination method and a device manufacturing method utilize such an X-ray optical apparatus for irradiating an object to be illuminated, such as a mask and a wafer, with the reflected X-ray beam, so that a pattern of the mask is transferred to the wafer.

17 Claims, 9 Drawing Sheets

OPTICAL ARRANGEMENT AND ILLUMINATION METHOD

FIELD OF THE INVENTION AND RELATED ART

This invention relates to an optical arrangement suitably usable, for example, in an optical system structure such as a spectrometer, a lithographic apparatus or an X-ray microscope wherein an electromagnetic beam such as synchrotron radiation light, for example, is used.

Figure 14:
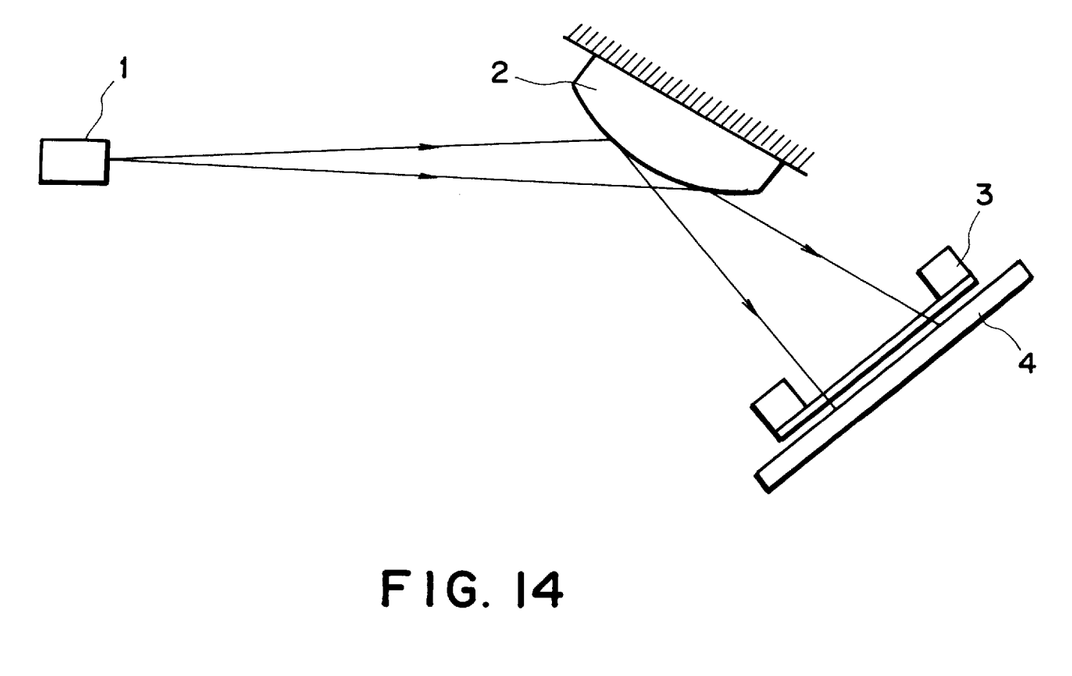
FIG. 14 is a schematic view for explaining the structure of a known type exposure apparatus.

An illumination optical system for use with synchrotron radiation light has been proposed in relation to an exposure apparatus using X-rays. In such an illumination optical system, a reflection mirror is used to reduce the intensity of short-wavelength components having adverse effects on the exposure process and also to expand the exposure region. In an exposure apparatus of the type that synchrotron radiation light having high directionality is once reflected by a mirror and is then projected onto a mask, usually the light projected onto a single point on the mask comprises light having been reflected by a small region on the mirrors FIG. 14 shows the structure of a known type exposure apparatus. This exposure apparatus comprises a synchrotron radiation light source 1, a convex mirror 2 for expanding the light beam, a mask 3 having a pattern to be transferred, and a wafer 8 having a resist coating.

SUMMARY OF THE INVENTION

In the structure described above, if the mirror surface has a fault such as a scratch or it is contaminated by dust or particles, for example, or if the machining precision of the mirror surface is insufficient, it may produce a local reduction in irradiation intensity upon the mask surface being irradiated with the radiation light as reflected by that mirror. This causes non-uniform exposure.

It is an object of the present invention to provide measures, suitably usable in an optical arrangement such as an exposure apparatus wherein an object to be irradiated with radiation with an optical element such as a mirror or suitably usable in an illumination method therefor, by which measures, the creation of non-uniformness of exposure is effectively avoided.

It is another object of the present invention to provide a device manufacturing method for producing microdevices, for example, by using the optical arrangement or illumination method such as described above.

In accordance with an aspect of the present invention, there is provided an optical arrangement for directing, through an optical element, an electromagnetic energy beam to an object to be irradiated, characterized by: a mechanism serviceable to cause elastic vibration in said optical element.

In this aspect of the present invention, said optical element may comprise a mirror for reflecting the electromagnetic energy beam.

As regards the elastic vibration produced, it may comprise lateral vibration out of a plane, longitudinal vibration along a plane, or surface elastic wave vibration.

The mechanism for causing the elastic vibration may suitably comprise a piezoelectric device, or an electromagnetic coil.

In accordance with another aspect of the present invention, there is provided an illumination method, characterized in that: an electromagnetic energy beam is reflected by a reflection surface having elastic vibration produced therein, such that an object to be illuminated is irradiated with the reflected energy beam.

In accordance with a further aspect of the present invention, there is provided a device manufacturing method, characterized in that: an electromagnetic energy beam is reflected by a reflection surface having elastic vibration produced therein, such that a mask and a wafer are irradiated with the reflected energy beam, whereby a pattern of the mask is transferred to the wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

The basic principle of the present invention will first be explained, before describing the preferred embodiments of the present invention.

If, during the exposure process, an elastic wave is produced in the reflection surface of an optical element to minutely and locally change the angle or curvature of the reflection surface, the direction of advancement of the light as reflected by the reflection surface having elastic waves produced changes periodically in accordance with the change in angle or curvature of the reflection surface. The light as reflected at a single point on the reflection surface irradiates a linear region of the surface to be illuminated. On the other hand, the light which impinges on a single point upon the mask corresponds to the accumulation of light rays having been reflected by a linear region of the mirror surface. Thus, when the mirror is oscillated as described, reflected light rays from a wide zone of the mirror surface are superposed. Therefore, even if the mirror has a non-uniform reflectivity because of a scratch or a particle on the reflection surface or due to the machining precision, the intensity of light projected is averaged and, thus, uniform exposure free from non-uniformness of illuminance is accomplished.

Use of elastic vibration of the mirror enables sufficient shortening of the period of vibration as compared with the exposure time. As a result, uniformness of exposure amount is maintained without keeping the timing of the start of exposure constant in each exposure process. In other words, there is no necessity of transmitting the information of the exposure start time moment to the mirror vibrating mechanism.

[Embodiment 1]

Figure 1:
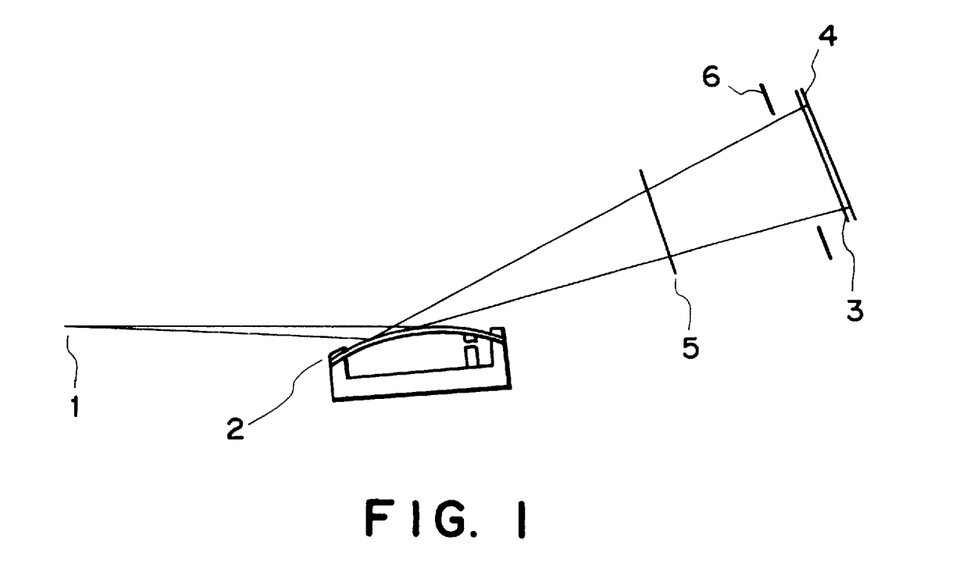
FIG. 1 is a schematic view of a main portion of an optical arrangement according to a first embodiment of the present invention.

FIG. 1 shows an optical arrangement according to a first embodiment of the present invention. In this embodiment, the invention is applied to an optical arrangement for an X-ray exposure apparatus to be used with synchrotron radiation light. More specifically, a synchrotron radiation light beam having a sheet-like shape, produced by a synchrotron radiation light source 1, is expanded by a convexed surface reflection mirror 2. The expanded radiation light beam goes through a beryllium (Be) window (X-ray extracting window), and it irradiates a mask 3 as a whole. By this, a pattern of the mask 3 is transferred to and printed on a wafer 4.

In this embodiment, both the distance from the light source 1 to the mirror 2 and the distance from the mirror 2 to the mask 3 are equal to 5 m, and the incidence angle of the light from the light source 1 upon the mirror 2 is 89 degrees.

Figure 2:
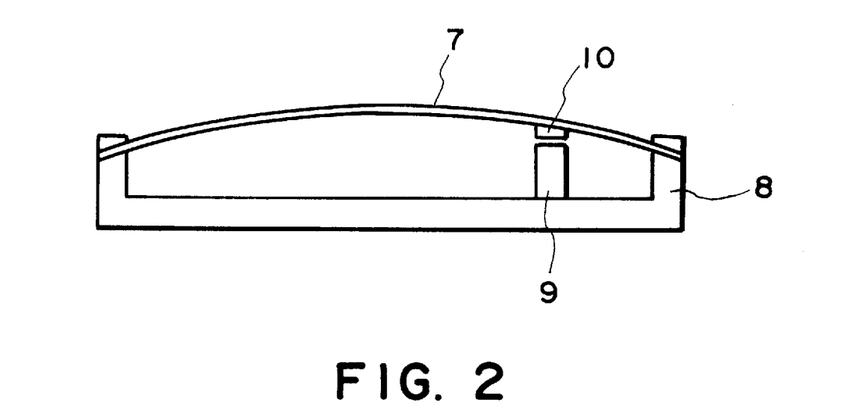
FIG. 2 is an enlarged view of a mirror of the first embodiment.

FIG. 2 shows details of the convex mirror and a holding mechanism therefor. The convex mirror has a cylindrical surface shape which is provided by flexing a thin flat substrate 7. As for the flat substrate 7, a segment of oblong shape cut out from a silicon wafer may be used. As regards the size of the flat substrate 7, the width is 50 mm, the length is 550 mm and the thickness is 1 mm. The substrate is held by a pair of holding mechanisms 8 disposed with a spacing of 500 mm. The pair of holding mechanisms applies to the silicon plate a couple of forces in opposite directions. The magnitude of the couple is adjustable. By changing the magnitude of the couple, the curvature of the mirror is set as desired. Permanent magnet 10 is mounted on the bottom face of the mirror substrate, more specifically, at a position off the center of the face of the mirror which does not serve to reflect light. Disposed opposed to the permanent magnet 10 of the mirror holding mechanism is a coil 9. In response to a supply of AC current to this coil 9, flexural vibration out of a plane is excited in the mirror substrate 7.

Figure 3:
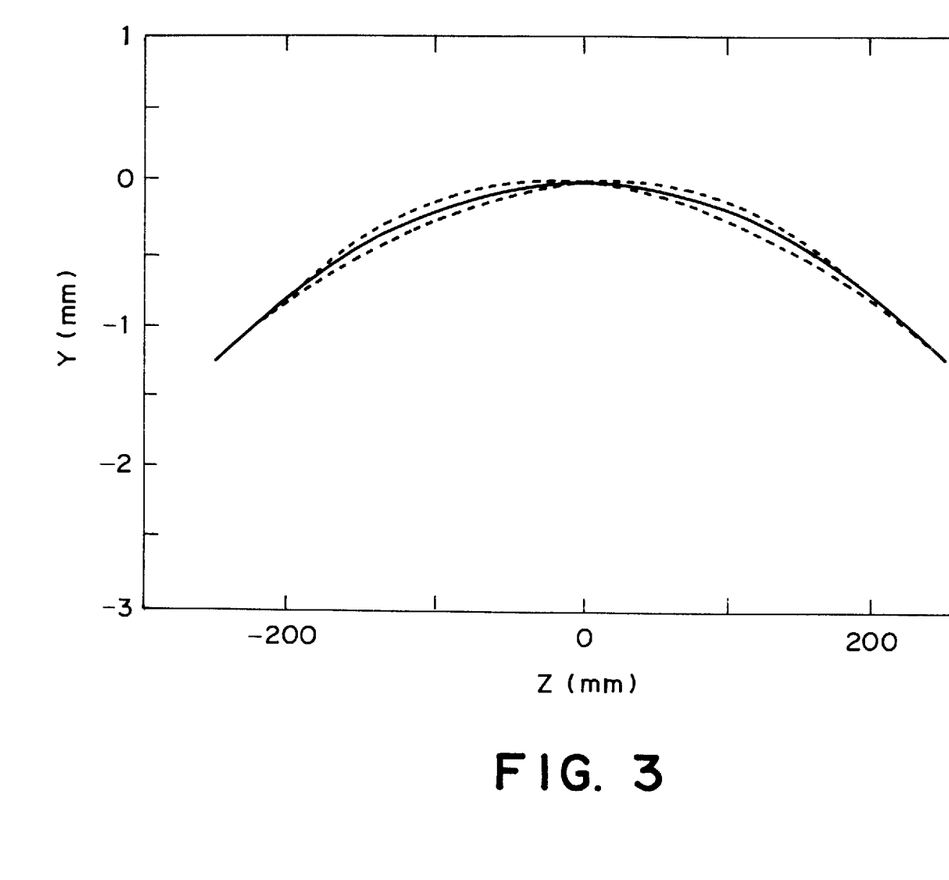
FIG. 3 is a graph for explaining vibration of the mirror of the first embodiment.

In this embodiment, by means of a couple, a silicon plate is flexed beforehand into a cylindrical surface shape having a curvature radius of 50 m, and subsequently, secondary flexural vibration of an amplitude of 0.066 mm is excited. The period of vibration is about 3.8 KHz. FIG. 3 shows the mirror shape as well as the vibration thereof. The central portion of the mirror functions as a node of vibration. Therefore, only the angle of the reflection surface changes periodically, while the position of the reflection surface is unchanged. With an amplitude of 0.066 mm, the amplitude of an angle at the mirror center is 0.5 mrad. The direction of advancement of light reflected by this surface changes periodically with an amplitude of 1 mrad. If the distance from the mirror to the mask is 5 m, then the light reflected at a single point on the mirror irradiates a linear region of the mask 1, having a length of 10 mm.

When the mirror is not vibrated, those light beams that are reflected at two points on the mirror surface being spaced from each other by a distance of 4.3 mm along the direction of elongation of the mirror, are projected on two points on the mask being spaced from each other by 1 mm. Thus, when the mirror vibrates such as described above, the light impinging on a single point upon the mask is provided by the accumulation of light rays as reflected from a linear region of the mirror surface, of a length 43 mm along the direction of elongation of the mirror. As described, when the mirror is vibrated, reflected light rays from a wide region of the mirror surface are superposed. Therefore, even if the mirror has a non-uniform reflectivity because of a scratch or a particle on the reflection surface or due to the machining precision, the intensity of light projected to the mask is averaged and, thus, uniform exposure free from non-uniformness of illuminance is accomplished.

At those positions off the center of the mirror, the position and angle of the mirror surface as well as the curvature radius of the mirror are all oscillated simultaneously. However, as regards displacement of the position on the mask as irradiated by reflected light, it applies substantially the same effect as that of the central portion of the mirror. As a result, throughout the whole mask surface, the intensity of light projected thereto is averaged and, thus, uniform exposure without non-uniformness in illuminance is accomplished.

If the period of vibration is not sufficiently short as compared with the exposure time, the exposure amount may not be sufficiently uniform unless the phase of vibration and the exposure start timing are maintained constant in each exposure process. As an example, if the exposure time is 1 second and the vibration period is 0.8 second, during one exposure process, the reflection light from the mirror moves reciprocally by 1.25 times along the mask surface. If the exposure process starts at a time when the reflection light is directed mostly upwardly, the illuminance at an upper region of the mask becomes higher than that at a lower region of the mask. If the exposure process starts at a time when the reflection light is directed mostly downwardly, the illuminance at the lower region of the mask becomes higher than that at the upper region of the mask. In this embodiment, the period of vibration of the mirror is about 0.00026 second. Thus, if the exposure time is about 1 second, the period of vibration can be said to be sufficiently short as compared with the exposure time. Therefore, without maintaining the exposure start timing constant in each exposure process, the exposure amount is kept uniform.

[Embodiment 2]

Figure 4:
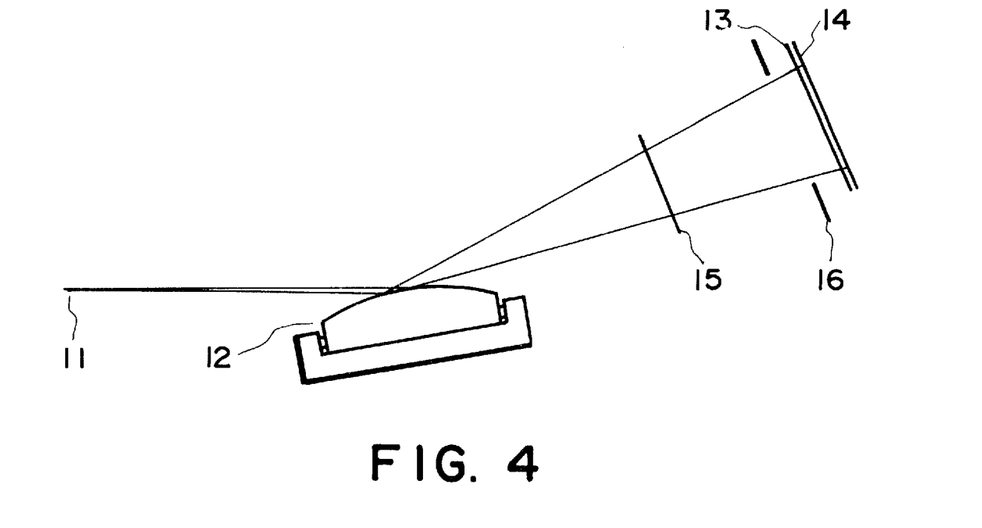
FIG. 4 is a schematic view of a main portion of an optical arrangement according to a second embodiment of the present invention.

FIG. 4 shows an optical arrangement according to a second embodiment of the present invention. In this embodiment, the invention is applied to an optical arrangement for an X-ray exposure apparatus having an undulator light source. More specifically, a beam from an undulator 11 is expanded by a convex mirror 12. The expanded beam passes through a beryllium window 15 and it irradiates a mask 13 as a whole. By this, a pattern of the mask is transferred to and printed on a wafer 14.

In this embodiment, the distance from the light source 11 to the mirror 12 is 3 m, and the distance from the mirror 12 to the mask 13 is 6 m. The angle of incidence of the light from the light source 11 onto the mirror 12 is 89.2 degrees.

Figure 5:
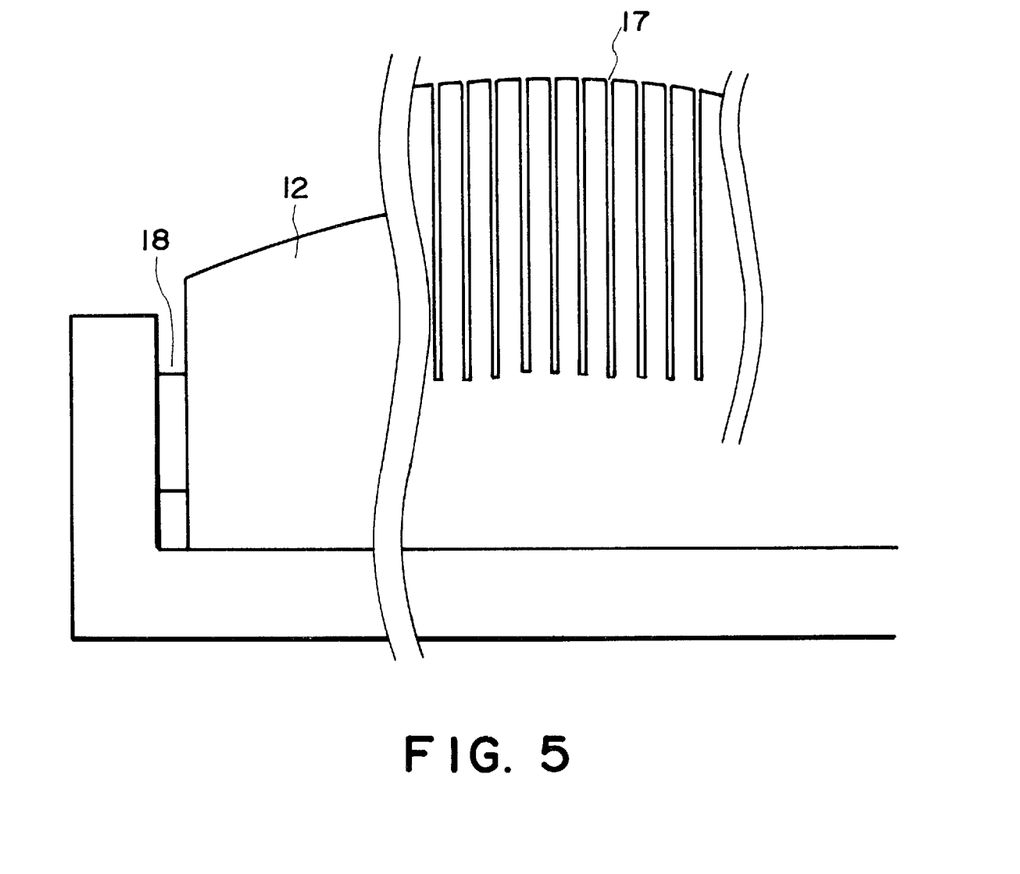
FIG. 5 is a fragmentary and enlarged view of a mirror of the second embodiment.

FIG. 5 shows details of the convex mirror as well as a holding mechanism therefor. The convex mirror is produced by polishing a fused silica substrate into a cylindrical surface shape, and slit-like notches 17 are formed in the surface thereof. The surface of the mirror is coated with a platinum thin film, so as to provide a higher reflectivity and to prevent damage of silica by irradiation with X-rays. The cylindrical surface has a curvature radius of 100 m. The spacing of slits (notches) is 1.05 mm, and the width of each slit is 0.05 mm. The depth of it is 10 mm. Thus, the mirror surface can be considered as being a combination of cantilevers each having a thickness of 1 mm and a length of 10 mm. No X-rays are reflected by the slit portion, and this causes a loss of light quantity. Therefore, the slit width should be made narrow, as much as possible. However, in this embodiment, the proportion of such loss is 5% or less. Thus, it does not cause a substantial reduction of productivity of the exposure apparatus.

Mounted on an end face of the mirror substrate is a piezoelectric device 18. In response to a supply of AC voltage to the piezoelectric device, longitudinal vibration is excited in the mirror substrate. The excitation frequency is 336 KHz which is coordinated with the resonance frequency of primary vibration of the cantilevers at the mirror surface. Due to the resonance of the cantilevers, as compared with the amplitude of the longitudinal vibration of the mirror substrate, the amplitude of the lateral vibration of the cantilevers becomes very large.

The reflection surface to the light from the light source is provided by the end faces of the cantilevers. If the amplitude of the end face of the lever is 2 microns, the amplitude of tilt of the reflection surface is about 0.4 mrad. Thus, the direction of advancement of the light reflected by this surface changes periodically with an amplitude of 0.8 mrad. Since the distance from the mirror to the mask is 6 m, the light as reflected at a single point on the mirror irradiates a linear region of the mask surface, having a length of 9.6 mm.

In accordance with a similar principle as that of the first embodiment described hereinbefore, the light impinging on a single point upon the mask is provided by accumulation of light rays as reflected from a linear region of the mirror surface, having a length of 43 mm along the direction of elongation of the mirror. As described, when the mirror is vibrated, reflected light rays from a wide region of the mirror surface are superposed. Therefore, even if the mirror has a non-uniform reflectivity because of a scratch or a particle on the reflection surface or due to the machining precision, the intensity of light projected to the mask is averaged and, thus, uniform exposure free from non-uniformness of illuminance is accomplished.

[Embodiment 3]

Figure 6:
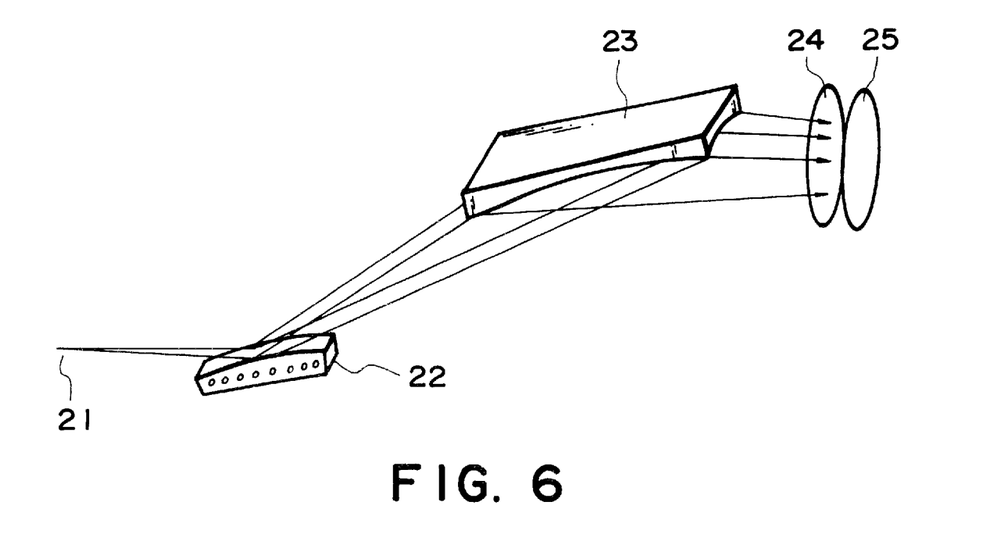
FIG. 6 is a schematic view of a main portion of an optical arrangement according to a third embodiment of the present invention.

FIG. 6 shows an illumination optical system according to a third embodiment of the present invention. Synchrotron radiation light produced by an electron accumulation ring (synchrotron radiation light source) 21 is collected and transformed into a parallel beam by means of two mirrors 22 and 23. By illuminating a mask 24 with the parallel beam, an absorbing material pattern formed on the mask is transferred to a wafer 25.

Each of the mirrors 22 and 23 comprises a multilayered film. In a case of a mirror using an ordinary metal or the like, if the incidence angle is slightly smaller than 90 degrees, a high X-ray reflectivity may be attained. However, if the incidence angle is further reduced, the reflectivity is lowered quickly. As compared therewith, when the mirror surface is provided by a multilayered film, a high reflectivity is attainable with a smaller incidence angle.

The first mirror 22 comprises a mirror of a saddle-like toroidal shape having a curvature of concavity in the X direction and convexity in the Y direction. The second mirror 23 comprises a mirror of cylindrical shape having a curvature of infinity in the X direction and concavity in the Y direction. Since the first mirror 22 functions to collect light in the X direction, the radiation light can be taken with a large angle.

In this embodiment, the distance from the light emission point 21 to the first mirror 22 is 3 m, and the distance from the first mirror 22 to the second mirror 23 is 3 m. The distance from the second mirror 23 to the mask 24 is 3 m. As regards both of the mirrors 22 and 23, the principal incidence angle of light to the mirror is 86 degrees. The combined focal length as a collimator is 3 mm with respect to the horizontal direction and 100 mm with respect to the vertical direction.

Specific numerical values of the mirror shape are as follows:

TABLE OF MIRROR CURVATURE RADIUS AND FOCAL LENGTH
(unit: mm)

| MIRROR NUMBER | X DIRECTION | | Y DIRECTION | |
|---|---|---|---|---|
| | CURVATURE RADIUS | FOCAL LENGTH | CURVATURE RADIUS | FOCAL LENGTH |
| 1 | 0.419 | 3 | −2.75 | −0.096 |
| 2 | Infinite | Infinite | 88.6 | 3.09 |

Figure 7:
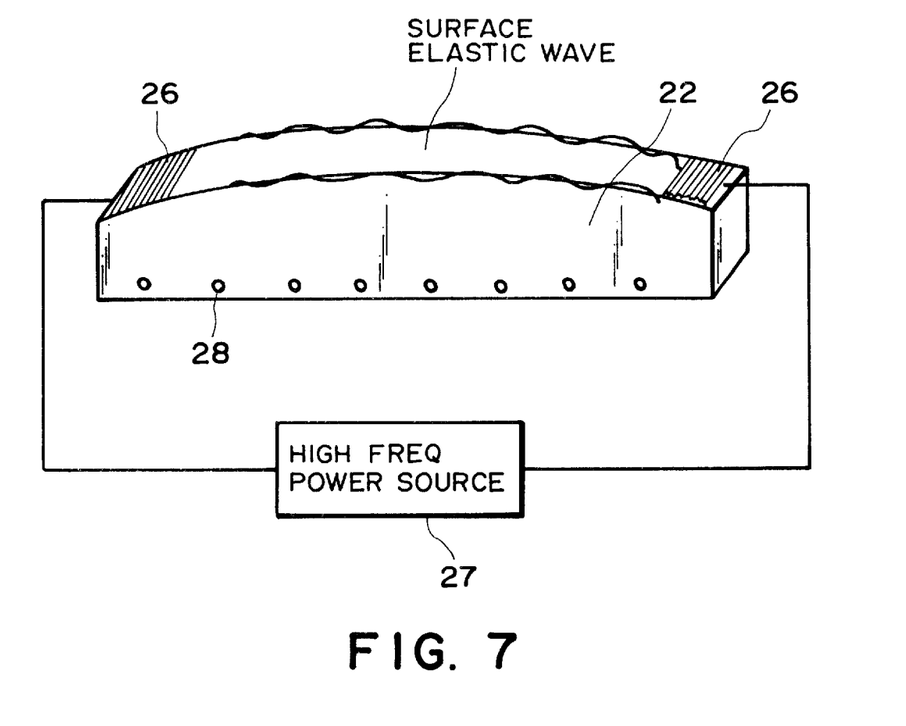
FIG. 7 is a schematic view for explaining details of a mirror of the third embodiment.

FIG. 7 shows details of the first mirror 22 and a holding mechanism therefor. Mounted at the opposite ends of the first mirror 22 substrate are comb-like shaped piezoelectric devices 26. In response to a supply of AC voltage to these piezoelectric devices by means of a high-frequency voltage source 27, a surface elastic wave (Rayleigh wave) is excited in the mirror substrate. The excitation frequency is 5 MHz. The surface elastic wave has a wavelength of about 1 mm and an amplitude of 0.16 micron. Since an elastic wave of high frequency attenuates largely in a solid member, heat is produced in the mirror. Also, heat is produced in the mirror due to absorption of light from the light source. If the temperature of the mirror changes, the shape of its reflection surface changes, causing a change in illuminance upon the mask surface. In this embodiment, in consideration thereof, a flow passageway 18 for flowing cooling water therethrough is formed in the mirror. By means of cooling by water, a temperature change of the mirror is avoided such that illuminance on the mask surface is maintained uniform.

The amplitude of local tilt of the reflection surface of the first mirror due to the surface elastic wave is about 0.1 mrad, and the direction of advancement of light reflected by this surface changes periodically with an amplitude of 0.2 mrad. As a result of this, the light impinging at a single point upon the mask is provided by accumulation of those light rays as having been reflected from a linear region of the first mirror surface, having a length of 10 mm along the direction of elongation of the first mirror, and reflected from a linear region of the second mirror surface having a length of 40 mm along the direction of elongation of the second mirror.

As described, when the mirror is vibrated, reflected light rays from a wide region of the mirror surface are superposed. Therefore, even if the mirror has a non-uniform reflectivity because of a scratch or a particle on the reflection surface or due to the machining precision, the intensity of light projected to the mask is averaged and, thus, uniform exposure free from non-uniformness of illuminance is accomplished.

Further, since the period of vibration can be made sufficiently short as compared with the exposure time, uniform exposure without non-uniformness of illuminance is accomplished without synchronization, in the exposure process, of the mirror vibration and the exposure start timing.

[Embodiment 4]

Figure 8:
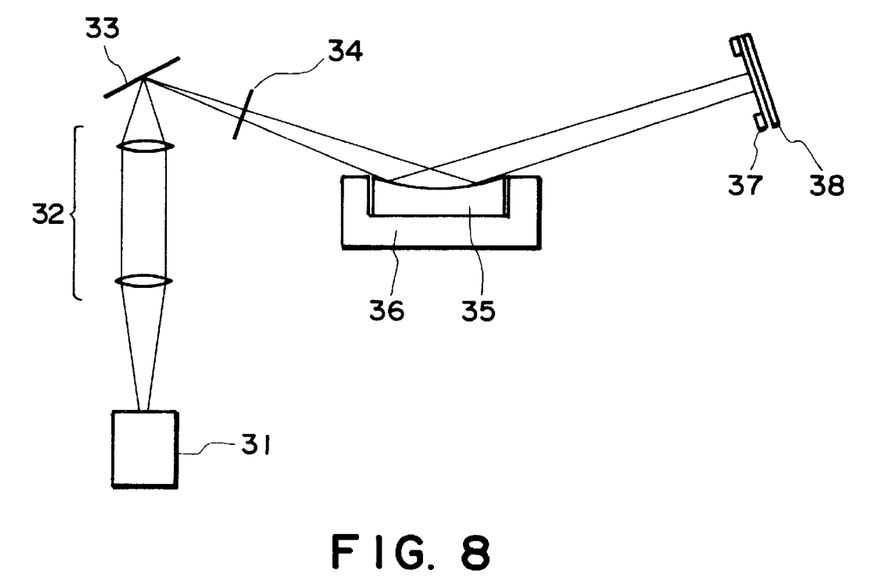
FIG. 8 is a schematic view of a main portion of an optical arrangement according to a fourth embodiment of the present invention.

FIG. 8 shows an illumination optical system according to a fourth embodiment of the present invention. In this embodiment, a divergent beam from a point light source of laser plasma X-ray source 31 is reflected by a mirror of a paraboloid of revolution, whereby a parallel beam is produced. The parallel beam goes through a mask, whereby a resist of a wafer is exposed. As regards the laser plasma light source 31, a pulse laser beam is converged by a lens 32, and the beam is then projected on a metal target 33 of strip shape, by which soft X-rays are produced. The thus produced soft X-rays go through a filter 34, comprising a diamond thin film, and thereafter they are reflected by a mirror 35. The mirror 35 is held by a mirror holder 36. The X-ray beam as reflected by the mirror 35 irradiates a mask 37, whereby a pattern of the mask is transferred to and printed on a wafer 38.

In this embodiment, the distance to the mirror 35 from the target 33 which is a substantial light source (light emitting point) is 3 m, and the distance from the mirror 35 to the mask 37 is 5 m. The angle of incidence of soft X-rays, at the central portion of the mirror, is 89.5 degrees.

Figure 9:
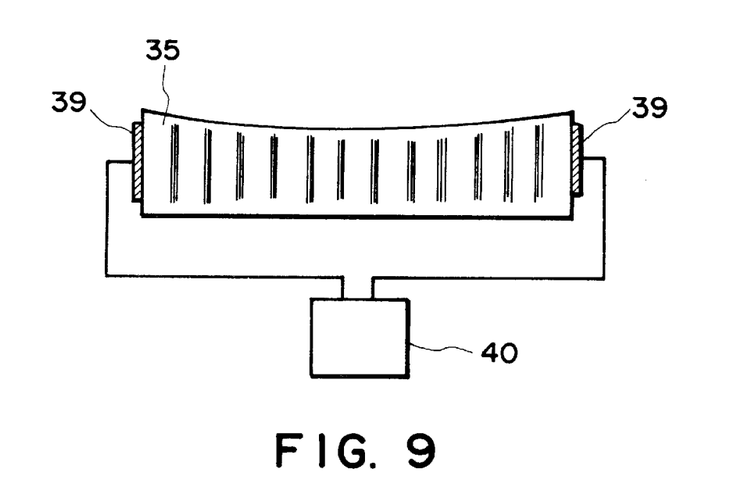
FIG. 9 is a schematic view for explaining details of a mirror of the fourth embodiment.

FIG. 9 shows details of the mirror 35. The mirror is made of SiC, and it has a width of 50 mm, a length of 400 mm and a thickness of 50 mm. Mounted on the opposite end faces of the mirror with respect to the direction of elongation thereof are piezoelectric devices 39. A high frequency voltage source 40 is connected to these piezoelectric devices, and a high frequency voltage having a frequency of 500 KHz can be applied to them. By this, a longitudinal wave advancing along the direction of elongation is excited in the mirror. The speed of the longitudinal wave is determined by the physical property of the mirror material, and it is about 5000 m/s in this embodiment. Thus, the wavelength of the longitudinal wave is about 10 mm.

With the advancement of the longitudinal wave, protrusions and recesses like those of sine waves are produced in the mirror reflection surface. When the amplitude of the wave at the surface is 0.14 micron, the maximum tilt of the reflection surface is 8.7 $\mu$rad. The light impinging at a single point on the mask is provided by accumulation of those light rays as reflected from a linear region of the mirror surface, having a length 10 mm along the direction of elongation of the mirror. Thus, when longitudinal vibration is excited in the mirror, reflected light rays from a wide region of the mirror surface are superposed. Therefore, even if the mirror has a non-uniform reflectivity because of a scratch or a particle on the reflection surface or due to the machining precision, the intensity of light projected to the mask is averaged.

If the period of vibration is not sufficiently short as compared with the exposure time, it is possible that the uniformness of exposure amount is deteriorated unless the phase of vibration and the exposure start timing are maintained constant in each exposure process. As an example, if the exposure time is 1 second and the vibration period is 0.8 second, during one exposure process, the reflection light from the mirror moves reciprocally by 1.25 times along the mask surface. If the exposure process starts at a time when the reflection light is directed mostly upwardly, the illuminance at an upper region of the mask becomes higher than that at a lower region of the mask. If the exposure process starts at a time when the reflection light is directed mostly downwardly, the illuminance at the lower region of the mask becomes higher than that at the upper region of the mask.

In this embodiment, the period of vibration of the mirror is about 2 microseconds. Thus, if the exposure time is about 1 second, the period of vibration can be said to be sufficiently short as compared with the exposure time. Therefore, without maintaining the exposure start timing constant in each exposure process, the exposure amount is kept uniform.

[Embodiment 5]

Figure 10:
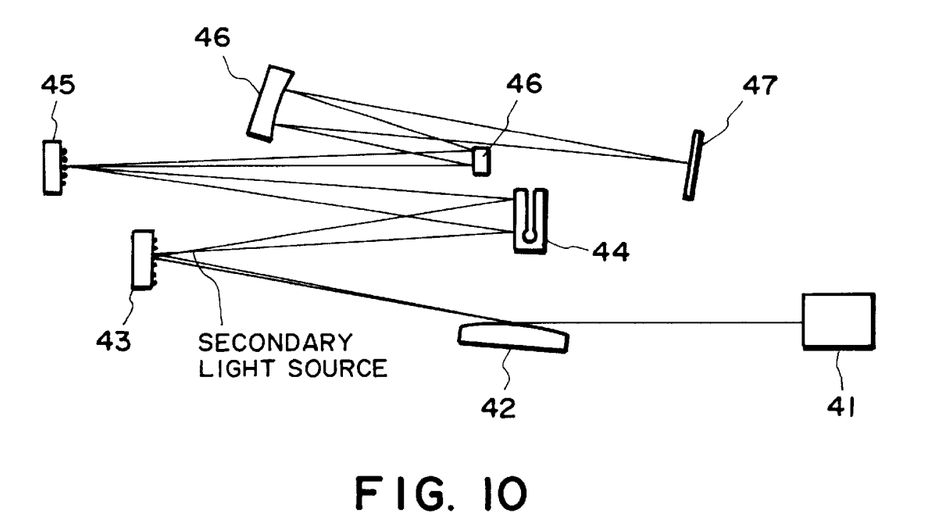
FIG. 10 is a schematic view of a main portion of an optical arrangement according to a fifth embodiment of the present invention.

FIG. 10 shows an illumination optical system according to a fifth embodiment of the present invention. In this embodiment, a beam from an undulator X-ray source 41 goes by way of a convex mirror 42, a fly's-eye mirror 43 and a vibratory concave mirror 44, in this order, and it irradiates a reflection type mask 45. The fly's eye mirror 43 comprises a mirror having a number of regularly arrayed small concave surfaces. It performs substantially the same function as that of a fly's-eye lens which is used in an ordinary illumination system of an exposure apparatus. Namely, a combination of a number of secondary light sources is formed just after the fly's eye mirror 43, and these secondary light sources are imaged upon the mask 45 by means of the vibratory concave mirror 44, whereby the mask is illuminated. An image of the reflection type mask 45 as illuminated is reduced by a Schwarzschild optical system 46 and is imaged on a wafer 47 having a resist coating. By this, a pattern of the mask is transferred to and printed on the wafer.

Figure 11:
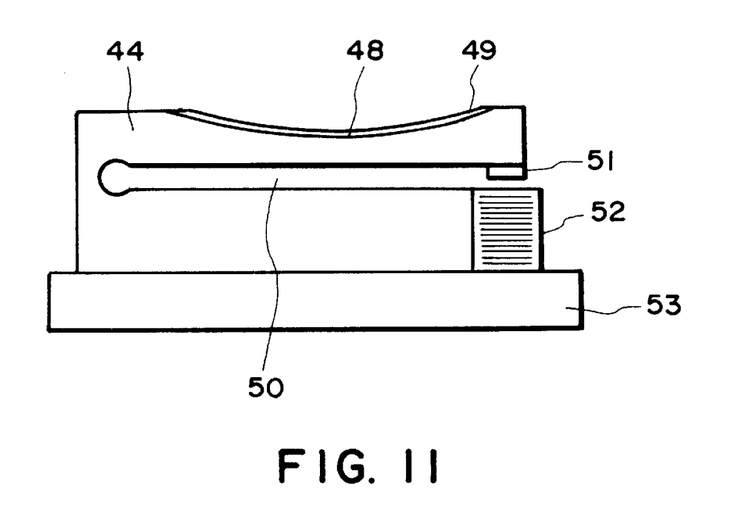
FIG. 11 is a schematic view for explaining details of a mirror of the fifth embodiment.

FIG. 11 shows details of the vibratory concave mirror 44. The vibratory concave mirror is made of SiC, and it is held by a mirror holder 53. The reflection surface 48 comprises a polished ellipsoid of revolution having a multilayered coating 49 thereon. As regards the structure of this multilayered film, an optimum structure is selected in accordance with the wavelength or wavelengths to be used. For example, when an X-ray beam having a wavelength of 13 nm is to be used, a multilayered film of a combination of molybdenum and silicon and having a thickness of about 6.5 nm may be used.

The vibratory concave mirror has a deep slit 50 formed therein, as illustrated. Disposed opposed to each other with the intervention of the slit 50 are a magnet 51 and a coil 52. AC voltage can be applied to the coil 52. In response to this, flexural vibration is produced in the mirror, above and below the slit. As a result of this, the image of the secondary light sources formed by the fly's-eye mirror moves reciprocally along the mask surface.

As described, when the mirror is vibrated, the light irradiating a single point on the reflection type mask is provided by superposed images of the secondary light sources. Therefore, even if the mirror has a non-uniform reflectivity because of a scratch or a particle on the reflection surface, the intensity of light projected to the mask is averaged.

In accordance with the embodiments described hereinbefore, elastic vibration is used to cause small vibration of a mirror. Thus, the period of vibration can be made sufficiently short as compared with the exposure time. As a result, uniformness of exposure amount is maintained without keeping the timing of the start of exposure constant in each exposure process. In other words, there is no necessity of transmitting the information of the exposure start time moment to the mirror vibrating mechanism.

Further, it is not necessary to use a detector or the like to measure the non-uniformness of illuminance prior to the exposure process or during the exposure process. Non-uniformness of illuminance can be avoided by a simple structure wherein one or more vibration mechanisms are used.

This assures reduction in cost of manufacture or operation of the apparatus, and provides high reliability. Additionally, because no bearing means or no sliding portion is used in the mirror vibration mechanism, the problem of wearing or dust creation does not arise. The lifetime of the apparatus is thus prolonged.

[Embodiment 6]

Next, an embodiment of a device manufacturing method according to the present invention, which uses an exposure apparatus such as described above, will be explained.

Figure 12:
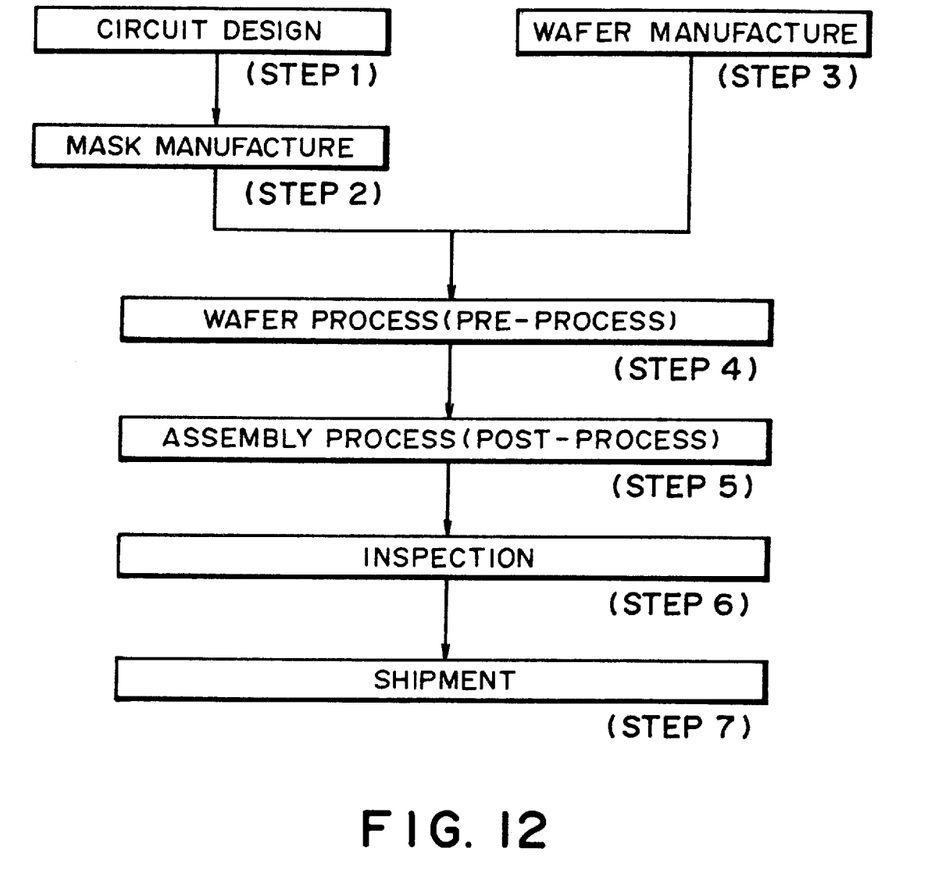
FIG. 12 is a flow chart for explaining device manufacturing processes.

FIG. 12 is a flow chart of the sequence of manufacturing a microdevice such as a semiconductor chip (e.g., an IC or an LSI), a liquid crystal panel, a CCD, a thin film magnetic head or a micro-machine, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 13:
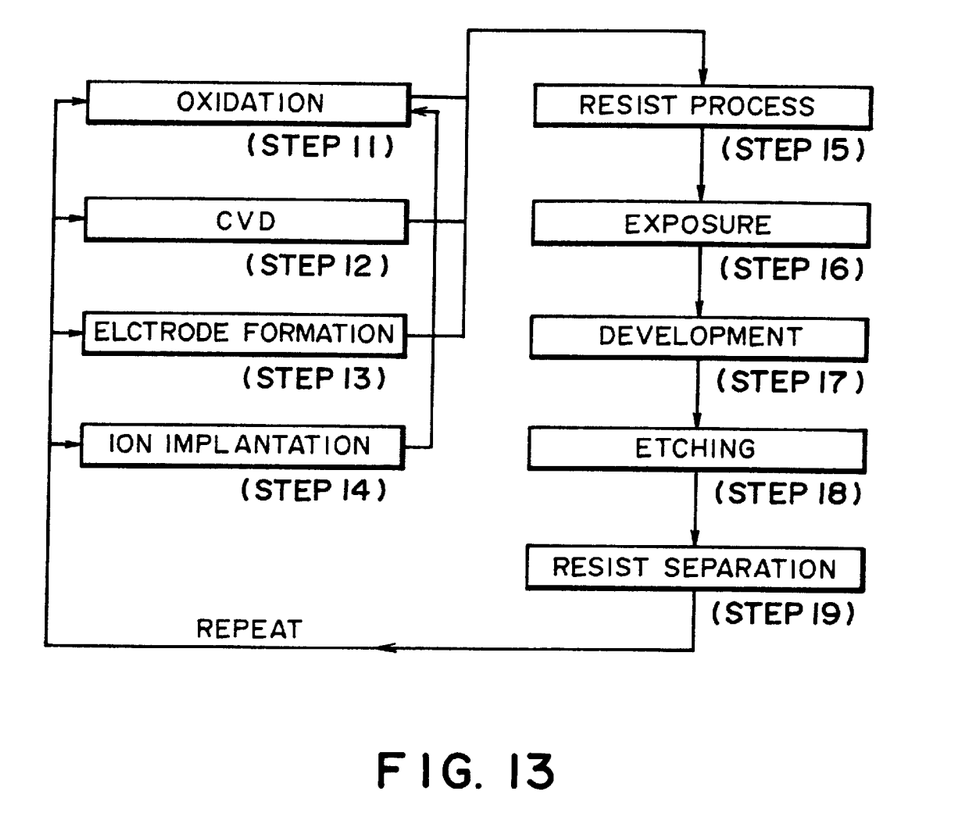
FIG. 13 is a flow chart for explaining details of a wafer process.

FIG. 13 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An X-ray optical apparatus comprising:
   a mirror element for reflecting an X-ray beam; and
   a mechanism for applying vibrations of a predetermined excitation frequency to said mirror element to produce elastic vibrations to cause deformation of the surface of said mirror element.

2. An apparatus according to claim 1, wherein said mirror element has a curved mirror surface.

3. An apparatus according to claim 1, wherein said mechanism includes a piezoelectric device.

4. An apparatus according to claim 1, wherein said mechanism includes an electromagnetic coil.

5. An apparatus according to claim 1, further comprising a mechanism for enlarging the amplitude of the elastic vibrations of said mirror element.

6. An apparatus according to claim 5, wherein said mechanism for enlarging the amplitude of the elastic vibrations comprises a slit structure.

7. An apparatus according to claim 1, wherein the X-ray beam comprises one of synchrotron radiation light from a synchrotron radiation source, X-rays from a laser plasma X-ray source, and X-rays from an undulator X-ray source.

8. An apparatus according to claim 1, wherein the elastic vibrations comprise lateral vibrations produced upon the mirror surface.

9. An apparatus according to claim 1, wherein the elastic vibrations comprise longitudinal vibrations produced upon the mirror surface.

10. An apparatus according to claim 1, wherein the elastic vibrations comprise surface elastic wave vibrations produced upon the mirror surface.

11. An apparatus according to claim 1, wherein the X-ray beam irradiates a substrate to be exposed.

12. An illumination method, comprising:
   reflecting an X-ray beam using a mirror element;
   applying vibrations of a predetermined excitation frequency to the mirror element to produce elastic vibrations to cause deformation of the surface of the mirror element; and
   irradiating an object to be illuminated with the reflected X-ray beam.

13. A device manufacturing method, comprising:
   reflecting an X-ray beam using a mirror element;
   applying vibrations of a predetermined excitation frequency to the mirror element to produce elastic vibrations to cause deformation of the surface of the mirror element; and
   irradiating a mask and a wafer with the reflected X-ray beam, whereby a pattern of the mask is transferred to the wafer.

14. An apparatus according to claim 1, wherein said mirror element has a slit.

15. An X-ray optical apparatus comprising:
   a mirror element, comprising slit means, for reflecting an X-ray beam; and
   means for applying vibration having a predetermined frequency to said mirror element to produce elastic vibration.

16. An apparatus according to claim 15, wherein said slit means of said mirror element comprises a plurality of slits which are provided substantially orthogonal to the surface of said mirror element.

17. An apparatus according to claim 15, wherein said slit means is provided substantially parallel to the surface of said mirror element.

* * * * *

UNITED STATES PATENT AND TRADEMARK OFFICE
CERTIFICATE OF CORRECTION

PATENT NO. : 5,825,844

DATED : October 20, 1998

INVENTORS : AKIRA MIYAKE, ET AL.

It is certified that error appears in the above-identified patent and that said Letters Patent is hereby corrected as shown below:

IN THE DRAWINGS

In FIG. 13, step 13, "ELCTRODE" should read --ELECTRODE--.

COLUMN 1:

line 21, "mirrors" should read --mirror.--.

Signed and Sealed this

First Day of June, 1999

Attest:

Q. TODD DICKINSON

Attesting Officer

Acting Commissioner of Patents and Trademarks